(12) United States Patent
Wang

(10) Patent No.: US 11,217,642 B2
(45) Date of Patent: Jan. 4, 2022

(54) DISPLAY PANEL, MANUFACTURING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Ao Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 355 days.

(21) Appl. No.: 16/472,349

(22) PCT Filed: Apr. 16, 2019

(86) PCT No.: PCT/CN2019/082899
§ 371 (c)(1),
(2) Date: Jun. 21, 2019

(87) PCT Pub. No.: WO2020/124894
PCT Pub. Date: Jun. 25, 2020

(65) Prior Publication Data
US 2021/0335931 A1 Oct. 28, 2021

(30) Foreign Application Priority Data
Dec. 18, 2018 (CN) .......................... 201811550109.7

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5259* (2013.01); *H01L 51/56* (2013.01)

(58) Field of Classification Search
None
See application file for complete search history.

(56) References Cited

U.S. PATENT DOCUMENTS

2019/0245019 A1   8/2019 Paek et al.
2019/0296099 A1*  9/2019 Lee ..................... H01L 27/3246

FOREIGN PATENT DOCUMENTS

CN   106531768 A   3/2017
CN   108281459 A   7/2018
(Continued)

OTHER PUBLICATIONS

"Wideband antireflective circular polarizer exhibiting a perfect dark state in organic light emitting-diode display" by Kim (Year: 2014).*

*Primary Examiner* — Evren Seven

(57) ABSTRACT

A display panel and a method of manufacturing the display panel are provided. The display panel includes an array substrate, a planarization layer, a pixel defining layer, an organic light emitting device, and an inorganic layer disposed between the planarization layer and the pixel defining layer to block moisture and oxygen. An encapsulation structure of the array substrate is cooperatively formed by a combination of a first interlayer dielectric layer contained in a thin-film transistor, the planarization layer, and the inorganic layer.

13 Claims, 6 Drawing Sheets

(56) References Cited

FOREIGN PATENT DOCUMENTS

| CN | 108288637 | A |   | 7/2018  |            |
|----|-----------|---|---|---------|------------|
| CN | 108511621 | A |   | 9/2018  |            |
| CN | 108615822 | A |   | 10/2018 |            |
| CN | 108899342 | A |   | 11/2018 |            |
| JP | 2006128077 |  | * | 5/2016  | ......... H01L 27/3267 |

* cited by examiner

DISPLAY PANEL, MANUFACTURING METHOD THEREOF, AND DISPLAY DEVICE

BACKGROUND OF INVENTION

1. Field of Invention

The present invention relates to a display field, and particularly, to a display panel, a manufacturing method thereof, and a display device.

2. Related Art

In display panels, organic light emitting diodes (OLEDs) emit light through organic light emitting materials of light emitting layers. Organic luminescent materials are prone to corrosion by moisture and oxygen, causing pixel shrinkage in OLED devices, thereby affecting a service life of the display panels and product yield.

Currently, a thin-film package is usually provided in organic light emitting devices for moisture and oxygen barrier. However, the thin-film encapsulation can only block intrusion of moisture and oxygen from upper layers of organic light emitting devices to light emitting layers, while current moisture and oxygen can erode the light emitting layers through bottom structures of the light emitting layers.

In a display panel industry, in order to realize a full screen design, it is necessary to bend a flexible circuit board at a lower boundary of a panel to be attached to a lower surface of a panel, and set a bending area in a terminal area, wherein an organic filling layer is provided below the bending area to relieve bending stress, and thus its moisture and oxygen barrier performance is pool. Therefore, the organic filling layer filled in the bending area and a substrate jointly constitute a channel for moisture and oxygen intrusion, causing a light emitting layer to be easily corroded by moisture and oxygen, thereby giving rise to product defects Therefore, it is imperative to provide a display panel, a manufacturing method thereof, and a display device to overcome the above-mentioned problem.

SUMMARY OF INVENTION

The present application provides a display panel and a manufacturing method thereof, and a display device to overcome a problem that moisture and oxygen in a current display panel intrude an organic light emitting device along a substrate, an organic filling layer, a planarization layer, and a pixel defining layer.

To overcome the above-mentioned problems, the present application provides a technical solution as follows:

In one aspect of the present invention, the present application provides a display panel, comprising an array substrate comprising a substrate and a thin-film transistor disposed on the substrate; a planarization layer disposed on the array substrate; a pixel defining layer disposed above the planarization layer, wherein the pixel defining layer comprises a plurality of pixel defining elements spaced apart from each other; an organic light emitting device disposed between adjacent pixel defining elements; and an inorganic layer disposed between the planarization layer and the pixel defining layer and configured to block moisture and oxygen; wherein an encapsulation structure for a bottom of the organic light emitting device is cooperatively formed by a combination of a first interlayer dielectric layer contained in the thin-film transistor, the planarization layer, and the inorganic layer.

In a display panel of the present application, the thin-film transistor comprises an active layer disposed on the array substrate; a first gate insulating layer disposed on the active layer; a first metal layer disposed on the first gate insulating layer; a second gate insulating layer disposed on the first metal layer; a second metal layer disposed the second gate insulating layer; the first interlayer dielectric layer disposed on the second metal layer; and a source metal and a drain metal disposed on the first interlayer dielectric layer; wherein an anode metal of the organic light emitting device is electrically connected to the drain metal through a first via hole, and the organic light emitting device comprises the anode metal, a light emitting layer, and a cathode layer.

In a display panel of the present application, the first via hole extends through the inorganic layer and the planarization layer.

In a display panel of the present application, the first interlayer dielectric layer is an inorganic layer, and the planarization layer is an organic layer.

In a display panel of the present application, the display panel comprises a display area and a bending area disposed at a side of the display area, and wherein the thin-film transistor and the organic light emitting device are disposed in the display area, and an organic filling layer is disposed in the bending area and extends through the first gate insulating layer, the second gate insulating layer, and the first interlayer dielectric layer.

In a display panel of the present application, the display panel further comprises a second interlayer dielectric layer disposed between the planarization layer and the first interlayer dielectric layer, and wherein the second interlayer dielectric layer is connected to the organic filling layer, and the second interlayer dielectric layer and the organic filling layer are made of a same material.

In a display panel of the present application, the display panel further comprises a stress buffer unit disposed in the display area, and wherein the stress buffer unit sequentially extends through the first gate insulating layer, the second gate insulating layer, and the first interlayer dielectric layer, and is connected to the second interlayer dielectric layer.

In a display panel of the present application, the first metal layer comprises a first gate metal, and the second metal layer comprises a second gate metal.

In a display panel of the present application, the display panel further comprises a buffer layer disposed between the substrate and the thin-film transistor.

In another aspect of the present invention, the present application further provides a method of manufacturing a display panel, comprising following steps:
S10: providing an array substrate comprising a substrate and a thin-film transistor disposed on the substrate;
S20: forming a planarization layer on the array substrate;
S30: forming an inorganic layer on the planarization layer to block moisture and oxygen, and forming a first via hole in the inorganic layer and the planarization layer; and
S40: forming a pixel defining layer comprising a plurality of pixel defining elements spaced apart from each other on the inorganic layer, and forming an organic light emitting device between adjacent pixel defining elements;
wherein a first interlayer dielectric layer contained in the thin-film transistor, the planarization layer, and the inorganic layer cooperatively form an encapsulation structure for a bottom of the organic light emitting device.

In a method of manufacturing the display panel of the present application, the step S30 comprises patterning, by using a first mask process, the planarization layer to form the first via hole, wherein the inorganic layer is formed on the patterned planarization layer, and removing, by using a second mask process, an inorganic material in the first via hole to form the first via hole.

In a method of manufacturing the display panel of the present application, the step S30 comprises forming the inorganic layer on the planarization layer, and pattering the inorganic layer and the planarization layer by using a first mask process to form the first via hole.

In another aspect of the present invention, the present application further provides a display device, comprising a display panel and a polarizer, wherein the display panel comprises an array substrate comprising a substrate and a thin-film transistor disposed on the substrate; a planarization layer disposed on the array substrate; a pixel defining layer disposed above the planarization layer, wherein the pixel defining layer comprises a plurality of pixel defining elements spaced apart from each other; an organic light emitting device disposed between adjacent pixel defining elements; and an inorganic layer disposed between the planarization layer and the pixel defining layer and configured to block moisture and oxygen; wherein an encapsulation structure is formed by a combination of a first interlayer dielectric layer contained in the thin-film transistor, the planarization layer, and the inorganic layer cooperatively form at a bottom of the organic light emitting device.

In a display device of the present application, the thin-film transistor comprises an active layer disposed on the array substrate; a first gate insulating layer disposed on the active layer; a first metal layer disposed on the first gate insulating layer; a second gate insulating layer disposed on the first metal layer; a second metal layer disposed the second gate insulating layer; the first interlayer dielectric layer disposed on the second metal layer; and a source metal and a drain metal disposed on the first interlayer dielectric layer; wherein an anode metal of the organic light emitting device is connected to the drain metal over the first via hole, and the organic light emitting device comprises the anode metal, a light emitting layer, and a cathode layer.

In a display device of the present application, the first via hole extends through the inorganic layer and the planarization layer.

In a display device of the present application, the first interlayer dielectric layer is an inorganic layer, and the planarization layer is an organic layer.

In a display device of the present application, the display panel comprises a display area and a bending area disposed at a side of the display area, and wherein the thin-film transistor and the organic light emitting device are disposed in the display area, and an organic filling layer is disposed in the bending area and extends through the first gate insulating layer, the second gate insulating layer, and the first interlayer dielectric layer.

In a display device of the present application, the display panel further comprises a second interlayer dielectric layer disposed between the planarization layer and the first interlayer dielectric layer, and wherein the second interlayer dielectric layer is connected to the organic filling layer, and the second interlayer dielectric layer and the organic filling layer are made of a same material.

In a display device of the present application, the display panel further comprises a stress buffer unit disposed in the display area, and wherein the stress buffer unit sequentially extends through the first gate insulating layer, the second gate insulating layer, and the first interlayer dielectric layer, and is connected to the second interlayer dielectric layer.

In a display device of the present application, the first metal layer comprises a first gate metal, and the second metal layer comprises a second gate metal.

The present application has advantageous effects as follows: the present application utilizes the newly added inorganic layer disposed between the planarization layer and the pixel defining layer to allow the first interlayer dielectric layer, the planarization layer, and the inorganic layer to cooperatively form an encapsulation structure for a bottom of the organic light emitting device, thereby to prevent moisture and oxygen from intruding into the organic light emitting device from a bottom of the light emitting layer, and improve a service life of the organic light emitting device.

BRIEF DESCRIPTION OF DRAWINGS

To describe the technical solutions in the embodiments or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF PREFERRED EMBODIMENTS

The following embodiments are described with reference to the accompanying drawings, and are used to exemplify specific embodiments for implementation of the present invention. Terms about directions mentioned in the present invention, such as "upper", "lower", "front", "rear", "left", "right", "in", "out", and "side surface" merely refer to directions in the accompanying drawings. Therefore, the used terms about directions are used to describe and understand the present invention, and are not intended to limit the present invention. In the figures, units having similar structures are represented by using a same reference number.

The present application provides a display panel and a manufacturing method thereof, and a display device to overcome a problem that moisture and oxygen in a current display panel intrude an organic light emitting device along a substrate, an organic filling layer, a planarization layer, and a pixel defining layer.

Figure 1:
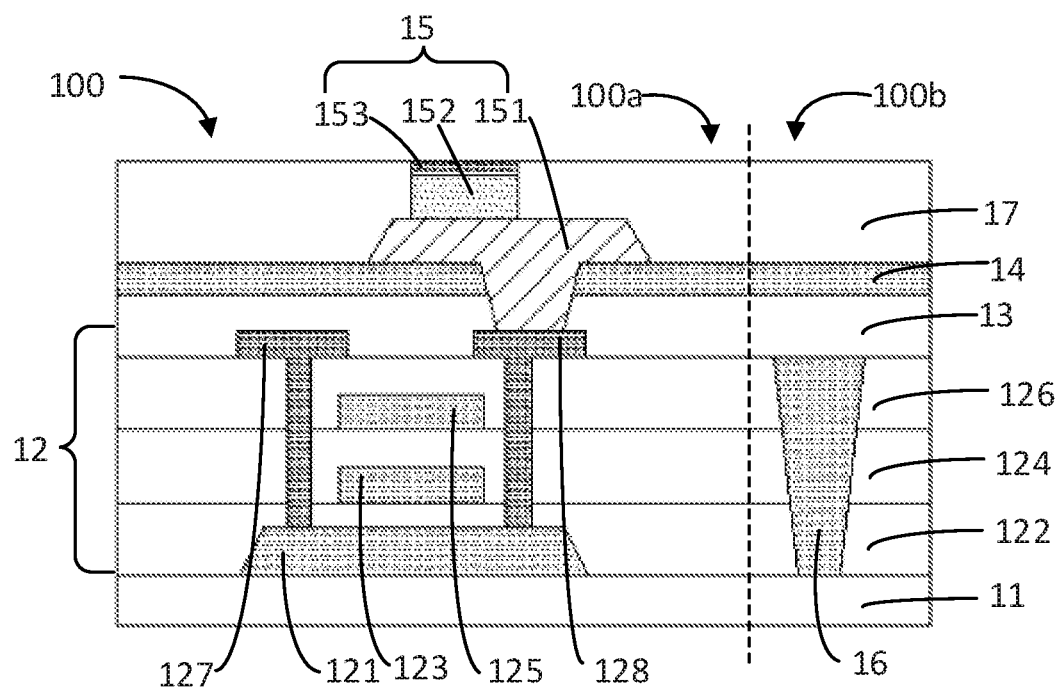
FIG. 1 is a cross-sectional view of a display panel of a first embodiment of the present application.

Please refer to FIG. 1. FIG. 1 is a cross-sectional view of a display panel 100 of a first embodiment of the present application.

According to one aspect of the present application, the present application provides the display panel 100 including an array substrate, a planarization layer 13, a pixel defining layer, an organic light emitting device 15, and an inorganic layer 14 disposed between the planarization layer 13 and the pixel defining layer.

The array substrate includes a substrate 11 and a thin-film transistor 12 disposed on the substrate 11.

In one embodiment, a buffer layer is disposed between the substrate 11 and the thin-film transistor 12, wherein a material of the buffer layer includes one of silicon nitride and silicon oxide.

In one embodiment, in order to facilitate a bendable design of the display panel 100, the substrate 11 is a flexible substrate 11. A material of the flexible substrate 11 includes polyimide, and the polyimide is an organic substance having a low moisture and oxygen barrier performance.

In one embodiment, the thin-film transistor 12 includes:
an active layer 121 disposed on the array substrate;
a first gate insulating layer 122 disposed on the active layer 121;
a first metal layer 123 disposed on the first gate insulating layer 122;
a second gate insulating layer 124 disposed on the first metal layer 123;
a second metal layer 125 disposed the second gate insulating layer 124;
a first interlayer dielectric layer 126 disposed on the second metal layer 125; and a source metal 127 and a drain metal 128 disposed on the first interlayer dielectric layer 126; wherein an anode metal 151 of the organic light emitting device 15 is electrically connected to the drain metal 128 through a first via hole, and the organic light emitting device 15 includes the anode metal 151, a light emitting layer 152, and a cathode layer 153.

In one embodiment, the first via hole extends through the inorganic layer 14 and the planarization layer 13.

In one embodiment, the active layer 121 includes an intermediate channel portion and a source doping area and a drain doping area disposed at both ends of the channel portion. The source metal 127 is connected to the source doping area, and the drain metal 128 is connected to the drain doping area.

The first metal layer 123 includes a first gate metal, and the second metal layer 125 includes a second gate metal.

The planarization layer 13 is disposed on the source metal 127 and the drain metal 128.

A material of the planarization layer 13 is an organic material for planarizing a surface of the array substrate.

The inorganic layer 14 is disposed on a surface of the planarization layer 13 for blocking moisture and oxygen intrusion in a longitudinal direction.

The first interlayer dielectric layer 126 contained in the thin-film transistor 12, the planarization layer 13, and the inorganic layer 14 cooperatively form an encapsulation structure for a bottom of the light emitting layer 152, thereby to prevent moisture and oxygen from intruding into the light emitting layer 152 of the organic light emitting device 15 from a bottom of the organic light emitting device 15.

Since the first interlayer dielectric layer 126 is also made of an inorganic material, the first interlayer dielectric layer 126, the planarization layer 13, and the inorganic layer 14 cooperatively form an inorganic/organic/inorganic encapsulation structure, thereby to be capable of providing moisture and oxygen barrier performance the same as that of an encapsulation portion on the light emitting layer 152.

The pixel defining layer is disposed above the planarization layer 13 and includes a plurality of pixel defining elements 17 spaced apart from each other for defining pixel areas. The plurality of pixel defining elements 17 are made of an organic material.

The organic light emitting device 15 is disposed in a pixel area between adjacent pixel defining elements 17.

The organic light emitting device 15 includes the anode metal 151, the cathode layer 153, and the light emitting layer 152 disposed between the anode metal 151 and the cathode layer 153.

In one embodiment, the display panel 100 includes a display area 100a and a bending area 100b disposed at a side of the display area 100a.

The thin-film transistor 12 and the organic light emitting device 15 are disposed in the display area 100a. An organic filling layer 16 is disposed in the bending area 100b and extends through the first gate insulating layer 122, the second gate insulating layer 124, and the first interlayer dielectric layer 126.

Since the organic filling layer 16, the substrate 11, the planarization layer 13, and the pixel defining layer are all made of an organic material, and in the current display panel 100, the substrate 11, the organic filling layer 16, the planarization layer 13, and the pixel defining layer are in direct contact with each other, a channel for moisture and oxygen intrusion is thus formed. Furthermore, the inorganic layer 14 of the present application disposed between the planarization layer 13 and the pixel defining layer can provide moisture and oxygen barrier performance, thereby to prevent moisture and oxygen from intruding into a bottom of the light emitting layer 152.

In one embodiment, the organic filling layer 16 extends through the buffer layer, the first gate insulating layer 122, the second gate insulating layer 124, and the first interlayer dielectric layer 126.

Figure 2:
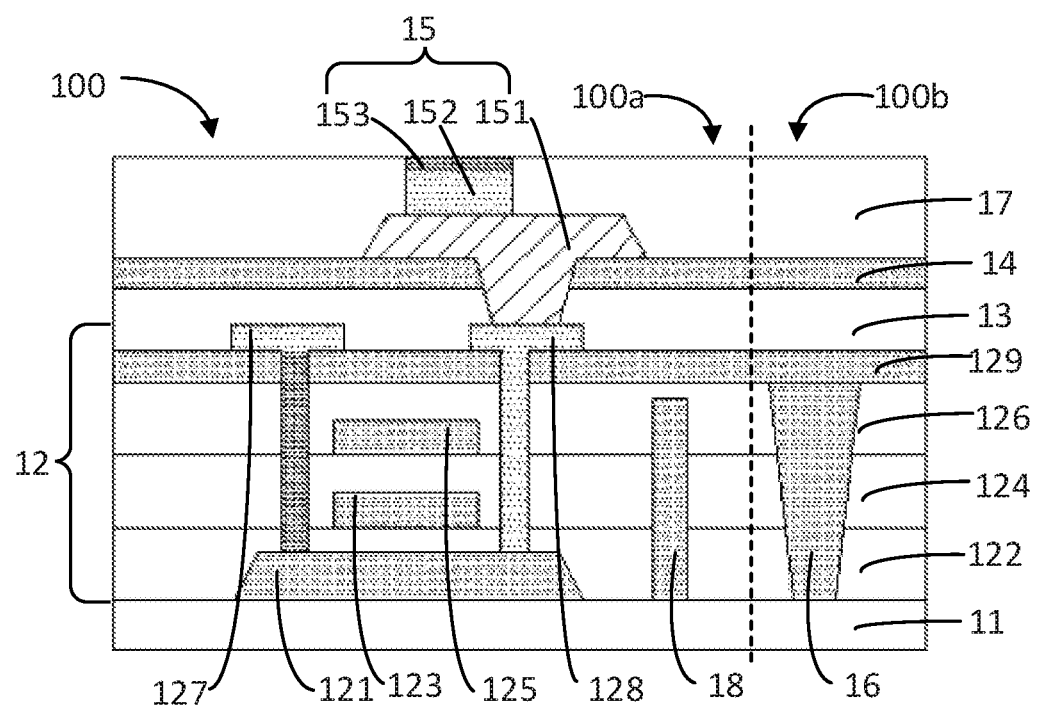
FIG. 2 is a cross-sectional view of a display panel of a second embodiment of the present application.

Please refer to FIG. 2. FIG. 2 is a cross-sectional view of a display panel of a second embodiment of the present application.

In one embodiment, the display panel 100 further includes a second interlayer dielectric layer 129 disposed between the planarization layer 13 and the first interlayer dielectric layer 126, and the second interlayer dielectric layer 129 is connected to the organic filling layer 16, wherein the second interlayer dielectric layer 129 and the organic filling layer 16 are made of a same material.

In one embodiment, the display panel 100 further includes a stress buffer unit 18 disposed in the display area 100a. The stress buffer unit 18 sequentially extends through the first gate insulating layer 122, the second gate insulating layer 124, and the first interlayer dielectric layer 126, and is spaced apart from the second interlayer dielectric layer 129.

In one embodiment, the stress buffer unit 18 sequentially extends through the buffer layer, the first gate insulating layer 122, the second gate insulating layer 124, and the first interlayer dielectric layer 126, and is connected to the second interlayer dielectric layer 129.

Figure 3:
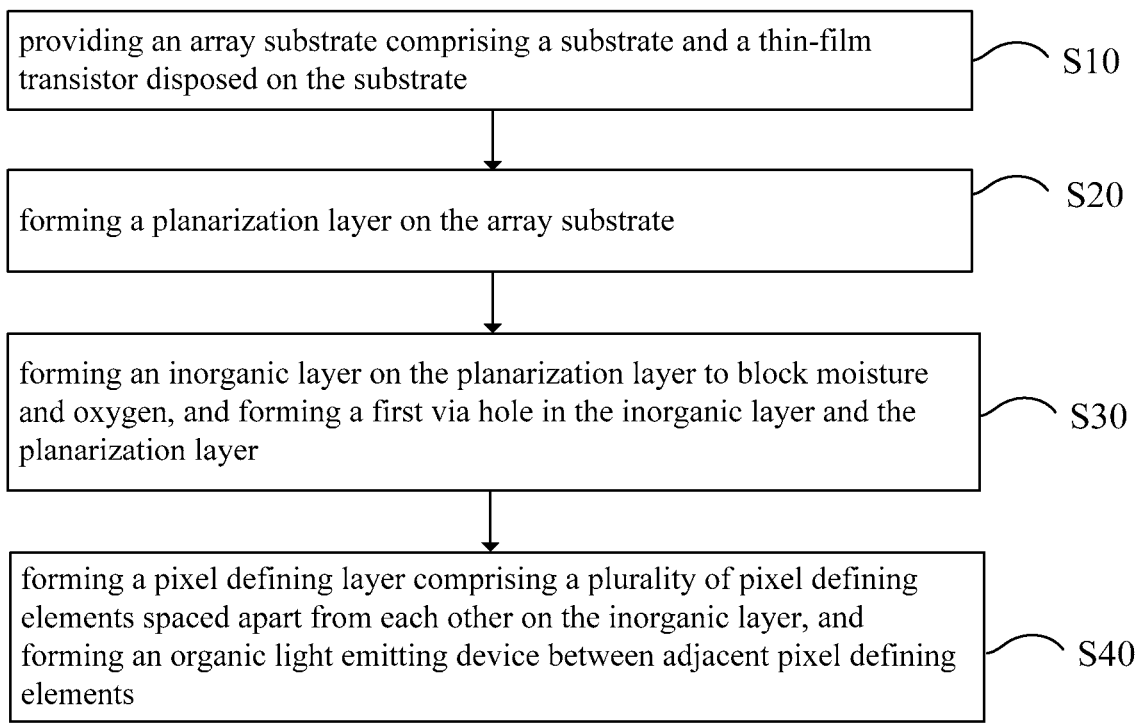
FIG. 3 is a cross-sectional view of a display panel of a third embodiment of the present application.
Figure 4A:
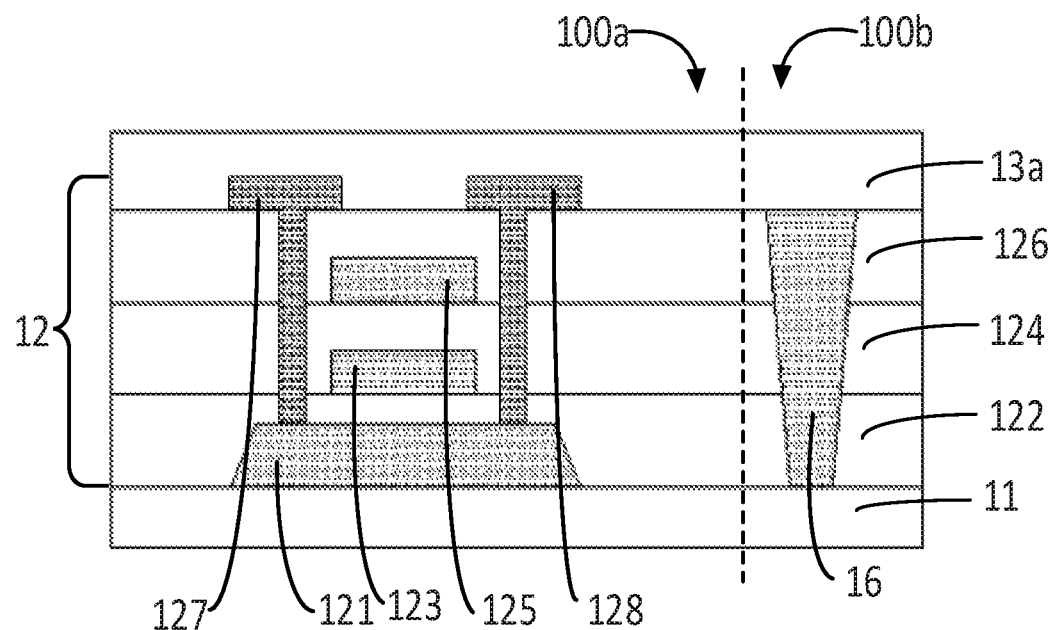
FIGS. 4a-4d are schematic structural views with respect to a step S30 of the third embodiment of the present application.
Figure 4B:
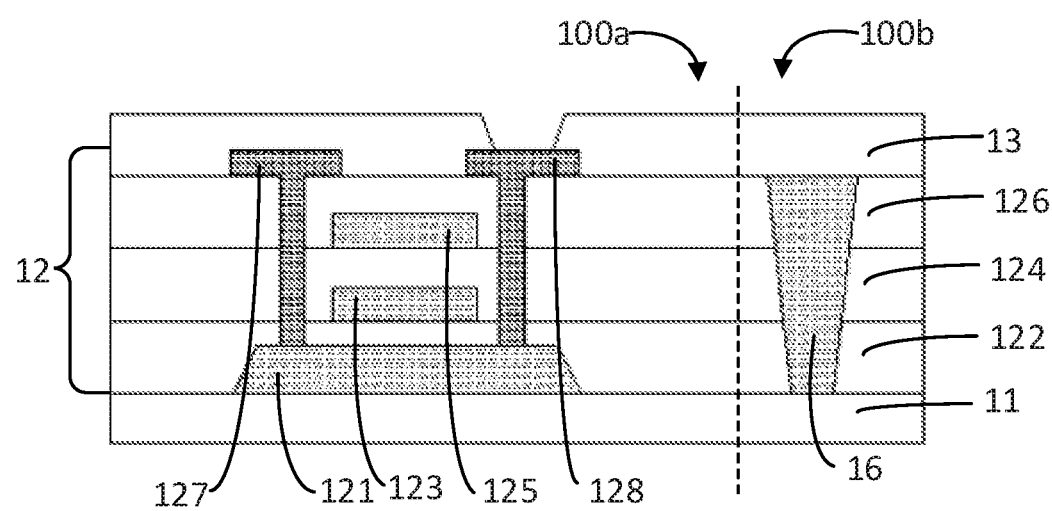
Figure 4C:
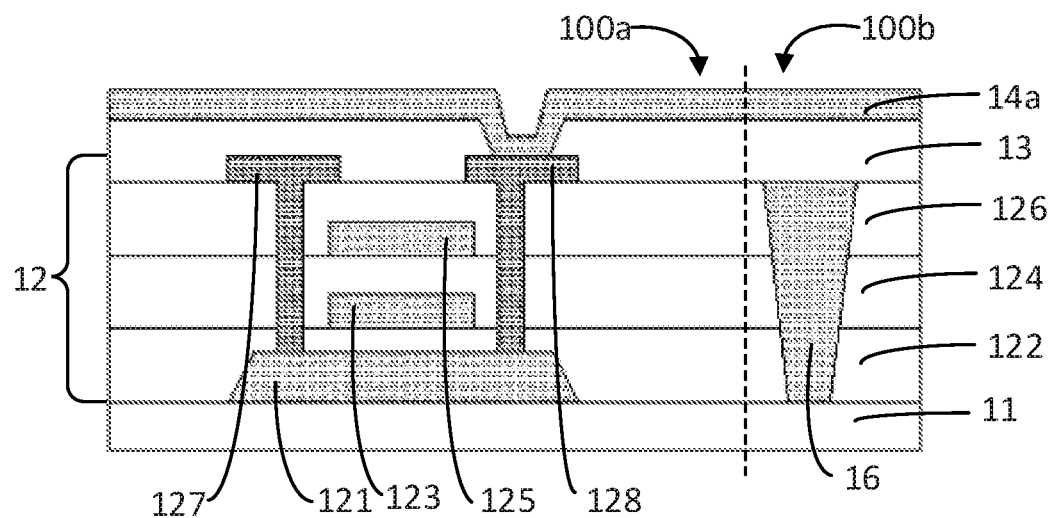
Figure 4D:
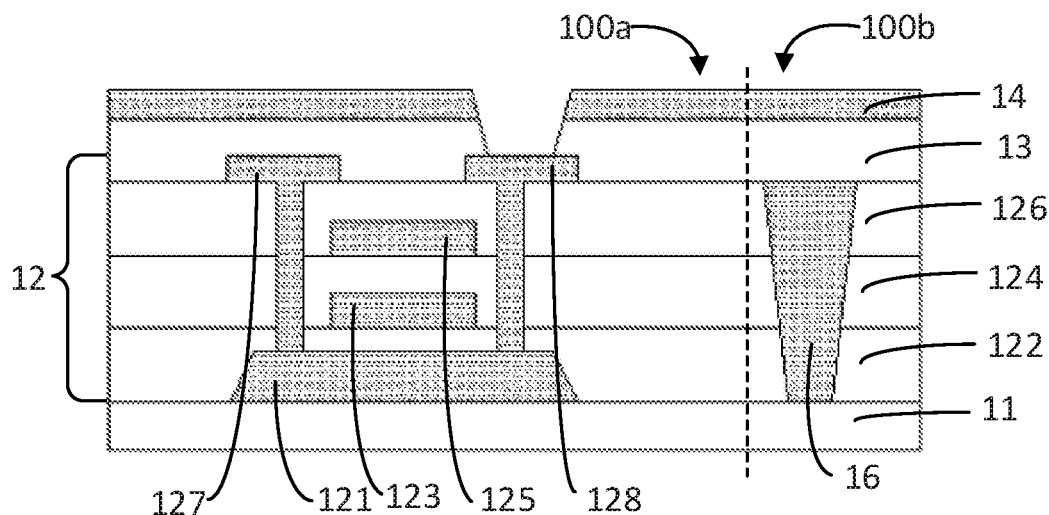

Please refer to FIG. 3. FIG. 3 is a cross-sectional view of a display panel 100 of a third embodiment of the present application.

According to another aspect of the present application, the present application further provides a method of manufacturing a display panel 100, including the following steps:
S10: providing an array substrate including a substrate 11 and a thin-film transistor 12 disposed on the substrate 11;
S20: forming a planarization layer 13 on the array substrate;
S30: forming an inorganic layer 14 on the planarization layer 13 to block moisture and oxygen, and forming a first via hole in the inorganic layer 14 and the planarization layer 13; and
S40: forming a pixel defining layer including a plurality of pixel defining elements 17 spaced apart from each other on the inorganic layer 14, and forming an organic light emitting device 15 between adjacent pixel defining elements 17;
wherein a first interlayer dielectric layer 126 contained in the thin-film transistor 12, the planarization layer 13, and the inorganic layer 14 cooperatively form an encapsulation structure for a bottom of a light emitting layer 152.

In one embodiment, in order to facilitate a bendable design of the display panel 100, the substrate 11 is a flexible substrate 11. A material of the flexible substrate 11 includes polyimide, and the polyimide is an organic substance having a low moisture and oxygen barrier performance.

In one embodiment, the thin-film transistor 12 includes:
an active layer 121 disposed on the array substrate;
a first gate insulating layer 122 disposed on the active layer 121;
a first metal layer 123 disposed on the first gate insulating layer 122;
a second gate insulating layer 124 disposed on the first metal layer 123;
a second metal layer 125 disposed the second gate insulating layer 124;
a first interlayer dielectric layer 126 disposed on the second metal layer 125;
and a source metal 127 and a drain metal 128 disposed on the first interlayer dielectric layer 126, wherein an anode metal 151 of the organic light emitting device 15 is electrically connected to the drain metal 128 through a first via hole, and the organic light emitting device 15 includes the anode metal 151, a light emitting layer 152, and a cathode layer 153.

Please refer to FIGS. 4a-4d. FIGS. 4a-4d are schematic structural views with respect to a step S30 of the third embodiment of the present application.

In one embodiment, the step S30 includes: patterning, by using a first mask process, the planarization layer 13 to form the first via hole, wherein the inorganic layer 14 is formed on the patterned planarization layer 13, and removing, by using a second mask process, an inorganic material in the first via hole to form the first via hole.

Figure 5A:
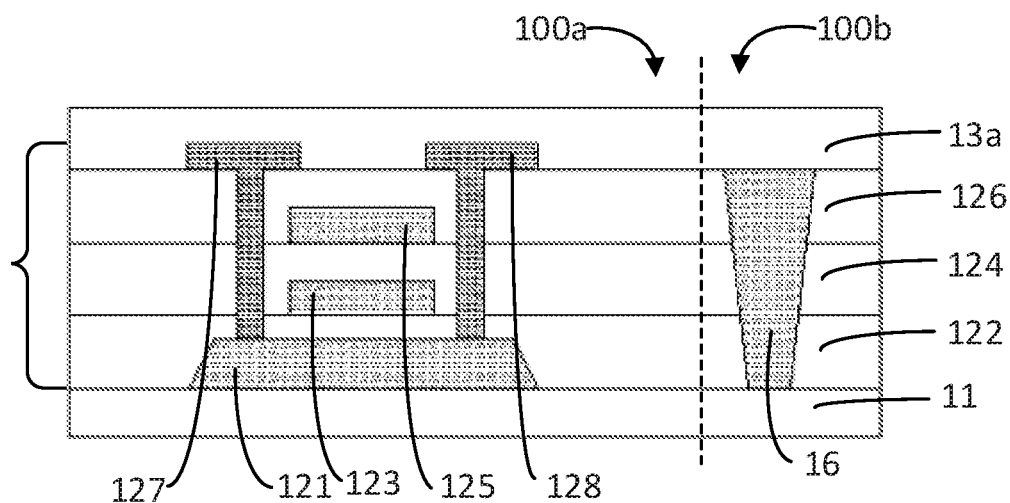
FIGS. 5a-5c are schematic structural views with respect to a step S30 of a fourth embodiment of the present application.
Figure 5B:
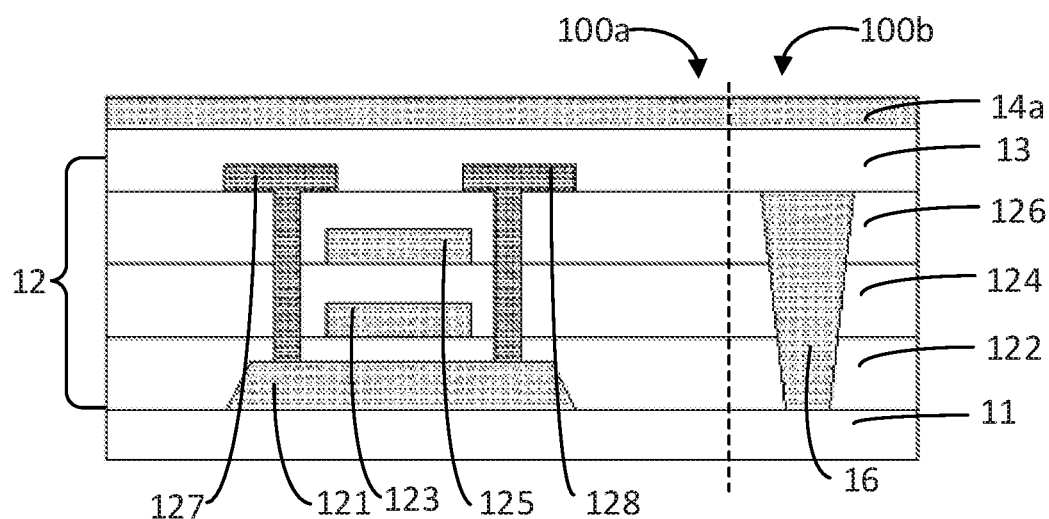
Figure 5C:
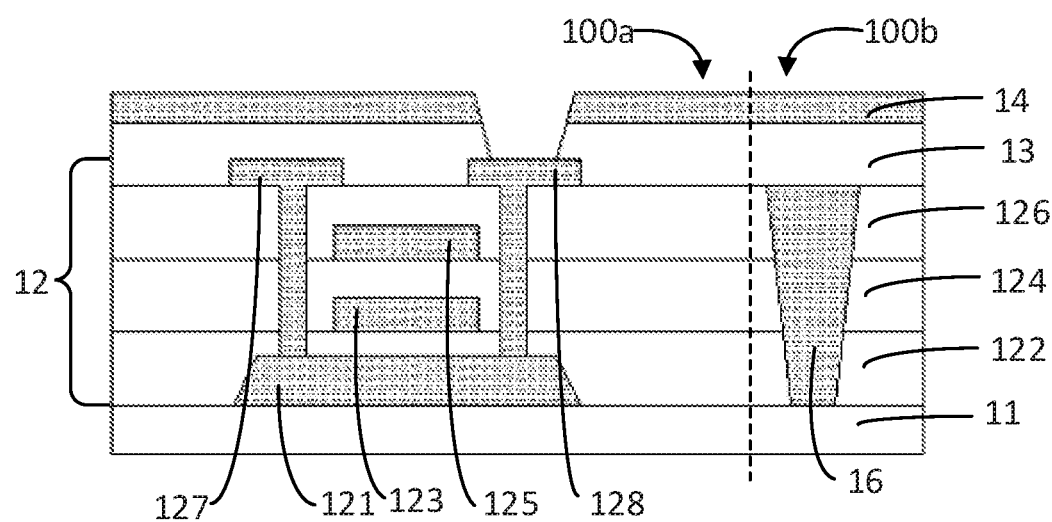

Please refer to FIGS. 5a-5c. FIGS. 5a-5c are schematic structural views with respect to a step S30 of a fourth embodiment of the present application.

In one embodiment, the step S30 includes: forming the inorganic layer 14 on the planarization layer 13, and patterning the inorganic layer 14 and the planarization layer 13 by using a first mask process to form the first via hole.

The planarization layer 13 is disposed on the source metal 127 and the drain metal 128.

A material of the planarization layer 13 is an organic material for planarizing a surface of the array substrate.

The inorganic layer 14 is disposed on a surface of the planarization layer 13 for blocking moisture and oxygen intrusion in a longitudinal direction.

The first interlayer dielectric layer 126 contained in the thin-film transistor 12, the planarization layer 13, and the inorganic layer 14 cooperatively form an encapsulation structure for a bottom of the light emitting layer 152, thereby to prevent moisture and oxygen from intruding into the light emitting layer 152 of the organic light emitting device 15 from a bottom of the organic light emitting device 15.

Since the first interlayer dielectric layer 126 is also made of an inorganic material, the first interlayer dielectric layer 126, the planarization layer 13, and the inorganic layer 14 cooperatively form an inorganic/organic/inorganic encapsulation structure, thereby to be capable of providing moisture and oxygen barrier performance the same as that of an encapsulation portion on the light emitting layer 152.

The pixel defining layer is disposed above the planarization layer 13 and includes a plurality of pixel defining elements 17 spaced apart from each other for defining pixel areas. The plurality of pixel defining elements 17 are made of an organic material.

The organic light emitting device 15 is disposed in a pixel area between adjacent pixel defining elements 17.

The organic light emitting device 15 includes the anode metal 151, the cathode layer 153, and the light emitting layer 152 disposed between the anode metal 151 and the cathode layer 153.

In one embodiment, the display panel 100 includes a display area 100a and a bending area 100b disposed at a side of the display area 100a.

The thin-film transistor 12 and the organic light emitting device 15 are disposed in the display area 100a. An organic filling layer 16 is disposed in the bending area 100b and extends through the first gate insulating layer 122, the second gate insulating layer 124, and the first interlayer dielectric layer 126.

In one embodiment, the organic filling layer 16 extends through the buffer layer, the first gate insulating layer 122, the second gate insulating layer 124, and the first interlayer dielectric layer 126.

Since the organic filling layer 16, the substrate 11, the planarization layer 13, and the pixel defining layer are all made of an organic material, and in the current display panel 100, the substrate 11, the organic filling layer 16, the planarization layer 13, and the pixel defining layer are in direct contact with each other, a channel for moisture and oxygen intrusion is thus formed. Furthermore, the inorganic layer 14 of the present application disposed between the planarization layer 13 and the pixel defining layer can provide moisture and oxygen barrier performance, thereby to prevent moisture and oxygen from intruding into a bottom of the light emitting layer 152.

In one embodiment, the display panel 100 further includes a second interlayer dielectric layer 129 disposed between the planarization layer 13 and the first interlayer dielectric layer 126, and the second interlayer dielectric layer 129 is connected to the organic filling layer 16, wherein the second interlayer dielectric layer 129 and the organic filling layer 16 are made of a same material.

In one embodiment, the display panel 100 further includes a stress buffer unit 18 disposed in the display area 100a. The stress buffer unit 18 sequentially extends through the first gate insulating layer 122, the second gate insulating layer 124, and the first interlayer dielectric layer 126, and is spaced apart from the second interlayer dielectric layer 129.

The present application has advantageous effects as follows: the present application utilizes the newly added inorganic layer disposed between the planarization layer and the pixel defining layer to allow the first interlayer dielectric layer, the planarization layer, and the inorganic layer to cooperatively form an encapsulation structure for a bottom of the organic light emitting device, thereby to prevent moisture and oxygen from intruding into the organic light emitting device from a bottom of the light emitting layer, and improve a service life of the organic light emitting device.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A display panel, comprising:
    a display area and a bending area disposed at a side of the display area;
    an array substrate comprising a substrate and a thin-film transistor disposed on the substrate, wherein the thin-film transistor comprises an active layer disposed on the array substrate, a first gate insulating layer disposed on the active layer, a first metal layer disposed on the first gate insulating layer, a second gate insulating layer disposed on the first metal layer, a second metal layer disposed the second gate insulating layer, a first interlayer dielectric layer disposed on the second metal layer; and a source metal and a drain metal disposed on the first interlayer dielectric layer;
    a planarization layer disposed on the array substrate;
    a pixel defining layer disposed above the planarization layer, wherein the pixel defining layer comprises a plurality of pixel defining elements spaced apart from each other;
    an organic light emitting device disposed between adjacent pixel defining elements and comprising an anode metal, a light emitting layer, and a cathode layer, wherein the anode metal is electrically connected to the drain metal through a first via hole; and
    an inorganic layer disposed between the planarization layer and the pixel defining layer and configured to block moisture and oxygen;
    wherein an encapsulation structure for a bottom of the organic light emitting device is cooperatively formed by a combination of the first interlayer dielectric layer contained in the thin-film transistor, the planarization layer, and the inorganic layer;
    wherein the thin-film transistor and the organic light emitting device are disposed in the display area, and an organic filling layer is disposed in the bending area and extends through the first gate insulating layer, the second gate insulating layer, and the first interlayer dielectric layer.

2. The display panel of claim 1, wherein the first via hole extends through the inorganic layer and the planarization layer.

3. The display panel of claim 2, wherein the first interlayer dielectric layer is an inorganic layer, and the planarization layer is an organic layer.

4. The display panel of claim 1, wherein the display panel further comprises a second interlayer dielectric layer disposed between the planarization layer and the first interlayer dielectric layer, and wherein the second interlayer dielectric layer is connected to the organic filling layer, and the second interlayer dielectric layer and the organic filling layer are made of a same material.

5. The display panel of claim 4, wherein the display panel further comprises a stress buffer unit disposed in the display area, and wherein the stress buffer unit sequentially extends through the first gate insulating layer, the second gate insulating layer, and the first interlayer dielectric layer, and is connected to the second interlayer dielectric layer.

6. The display panel of claim 1, wherein the first metal layer comprises a first gate metal, and the second metal layer comprises a second gate metal.

7. The display panel of claim 1, further comprising a buffer layer disposed between the substrate and the thin-film transistor.

8. A display device, comprising a display panel and a polarizer, wherein the display panel comprises:
    a display area and a bending area disposed at a side of the display area;
    an array substrate comprising a substrate and a thin-film transistor disposed on the substrate, wherein the thin-film transistor comprises an active layer disposed on the array substrate, a first gate insulating layer disposed on the active layer, a first metal layer disposed on the first gate insulating layer, a second gate insulating layer disposed on the first metal layer, a second metal layer disposed the second gate insulating layer, a first interlayer dielectric layer disposed on the second metal layer; and a source metal and a drain metal disposed on the first interlayer dielectric layer;
    a planarization layer disposed on the array substrate;
    a pixel defining layer disposed above the planarization layer, wherein the pixel defining layer comprises a plurality of pixel defining elements spaced apart from each other;
    an organic light emitting device disposed between adjacent pixel defining elements and comprising an anode metal, a light emitting layer, and a cathode layer, wherein the anode metal is connected to the drain metal over the first via hole; and
    an inorganic layer disposed between the planarization layer and the pixel defining layer and configured to block moisture and oxygen;
    wherein an encapsulation structure is formed by a combination of the first interlayer dielectric layer contained in the thin-film transistor, the planarization layer, and the inorganic layer cooperatively format a bottom of the organic light emitting device;
    wherein the thin-film transistor and the organic light emitting device are disposed in the display area, and an organic filling layer is disposed in the bending area and extends through the first gate insulating layer, the second gate insulating layer, and the first interlayer dielectric layer.

9. The display device of claim 8, wherein the first via hole extends through the inorganic layer and the planarization layer.

10. The display device of claim 9, wherein the first interlayer dielectric layer is an inorganic layer, and the planarization layer is an organic layer.

11. The display device of claim 8, wherein the display panel further comprises a second interlayer dielectric layer disposed between the planarization layer and the first interlayer dielectric layer, and wherein the second interlayer dielectric layer is connected to the organic filling layer, and the second interlayer dielectric layer and the organic filling layer are made of a same material.

12. The display device of claim 11, wherein the display panel further comprises a stress buffer unit disposed in the display area, and wherein the stress buffer unit sequentially extends through the first gate insulating layer, the second gate insulating layer, and the first interlayer dielectric layer, and is connected to the second interlayer dielectric layer.

13. The display device of claim 8, wherein the first metal layer comprises a first gate metal, and the second metal layer comprises a second gate metal.

* * * * *